United States Patent [19]
Chevallier et al.

[11] Patent Number: 5,767,711
[45] Date of Patent: *Jun. 16, 1998

[54] LEVEL DETECTION CIRCUIT AND METHOD

[75] Inventors: Christophe J. Chevallier, Palo Alto; Frankie F. Roohparvar, Cupertino; Michael S. Briner, San Jose, all of Calif.

[73] Assignee: Micron Quantum Devices, Inc., Santa Clara, Calif.

[*] Notice: The term of this patent shall not extend beyond the expiration date of Pat. No. 5,581,206.

[21] Appl. No.: 717,702

[22] Filed: Sep. 23, 1996

Related U.S. Application Data

[63] Continuation of Ser. No. 509,021, Jul. 28, 1995, Pat. No. 5,581,206.

[51] Int. Cl.$^6$ .................. H03L 7/00; H03K 5/22
[52] U.S. Cl. .................. 327/143; 327/77; 327/81; 327/89
[58] Field of Search .................. 327/142, 143, 327/198, 72, 77–81, 87, 88, 89, 530, 538, 543, 545, 546, 227, 228, 229, 230

[56] References Cited

U.S. PATENT DOCUMENTS

| | | | |
|---|---|---|---|
| 4,041,333 | 8/1977 | Porat | 327/581 |
| 4,309,627 | 1/1982 | Tabata | 327/143 |
| 4,437,025 | 3/1984 | Liu et al. | 326/70 |
| 4,584,492 | 4/1986 | Sharp | 327/541 |
| 4,658,156 | 4/1987 | Hashimoto | 327/77 |
| 4,922,133 | 5/1990 | Iwahashi et al. | 327/77 |
| 5,083,045 | 1/1992 | Yim et al. | 327/80 |
| 5,097,146 | 3/1992 | Kowalski et al. | 327/77 |
| 5,124,590 | 6/1992 | Liu et al. | 326/60 |
| 5,144,159 | 9/1992 | Frisch et al. | 327/143 |
| 5,214,316 | 5/1993 | Nagai | 327/143 |
| 5,278,458 | 1/1994 | Holland et al. | 327/77 |
| 5,280,198 | 1/1994 | Almulla | 327/535 |
| 5,378,936 | 1/1995 | Kokubo et al. | 327/77 |
| 5,469,100 | 11/1995 | Wuidart et al. | 327/263 |

FOREIGN PATENT DOCUMENTS

| | | | |
|---|---|---|---|
| 3-206709 | 9/1991 | Japan | 327/143 |

Primary Examiner—Toan Tran
Attorney, Agent, or Firm—Schwegman, Lundberg, Woessner & Kluth, P.A.

[57] ABSTRACT

A level detection circuit for monitoring the level of a power supply voltage and producing an output signal at power on for resetting various system elements powered by the supply voltage when the supply voltage reaches a predetermined level. The detection circuit, which is powered by the supply voltage includes a voltage reference circuit which produces a reference voltage having a magnitude which is relatively independent of the power supply voltage. A translator circuit functions to produce a translated voltage indicative of the supply voltage magnitude and which is comparable in magnitude to the reference voltage when the supply voltage is at a suitable level such that the system will accept a power on reset pulse. A comparator circuit functions to compare the reference voltage with the translated voltage and cause an associated output circuit to issue the reset pulse. The reset circuit typically includes a one shot circuit, the output of which is logically ORed with the amplified comparator output. The amplified comparator output functions to hold the system elements in a reset state at very low supply voltages and the one shot output functions to reset the system elements once the supply voltage is at a sufficiently high level.

41 Claims, 2 Drawing Sheets

LEVEL DETECTION CIRCUIT AND METHOD

This is a continuation of application Ser. No. 08/509,021, filed Jul. 28, 1995, now U.S. Pat. No. 5,581,206.

BACKGROUND OF THE INVENTION

1. Field of the Invention

The present invention relates generally to the field of level detection circuitry and in particular to circuitry for detecting the level of an input signal, such as a power supply voltage, which is also powered by the input signal.

2. Background of Related Art

Most electronic systems contain storage elements which have indeterminate states when the primary power source for the system is first applied or when the power source drops below some minimum operating level. Accordingly, it is often necessary to provide some means whereby the storage elements are set to a known state at initial power on or after a power drop. Such circuits are sometimes referred to as power on reset circuits.

One difficulty in implementing power on reset circuits is that such circuits must often be powered by the same voltage source that is monitored by the circuit. This can present a challenge, particularly if the circuit must ensure that the system is in a proper initial state at relatively low supply voltages. Furthermore, such reset circuits must operate reliably when the input supply voltage either has a very fast rise time or a slow rise time.

The present invention is capable of detecting input signals, such as power supply voltages, while being powered by such input signals. The input signal level is reliably and accurately detected and an output is provided to accommodate input signals having fast and slow rising inputs. These and other advantages of the present invention will be apparent to those skilled in the art upon a reading of the following Detailed Description of the Invention together with the drawings.

SUMMARY OF THE INVENTION

A level detection circuit for producing an detection output when an input signal reaches a predetermined level is disclosed. Typically the input signal is the primary power supply voltage of an electronic system reset by the detection circuit output at power on and at low power supply voltages. The detection circuit includes a voltage reference circuit means for producing a reference voltage having a magnitude which is relatively independent of the input signal magnitude once the input signal has reached a first operating voltage.

The level detection circuit further includes translator circuit means for producing a translated voltage having a magnitude which is indicative of the magnitude of the input signal. Preferably, this element includes a series-connected MOS transistor and a resistor, with the output of the translator circuit means being produced at the junction of these two devices. A comparator means is provided for comparing the reference voltage and the translated voltage and for producing a comparator output based upon the comparison. The comparator means is powered by the input signal. The remaining elements of the subject detection circuit are also typically powered by the input signal. In addition, output means is used for producing the detection output signal in response to the comparator output. The output means preferably includes some form of pulse shaping circuitry such as an inverter followed by a one shot circuit.

DETAILED DESCRIPTION OF THE INVENTION

Figure 1:
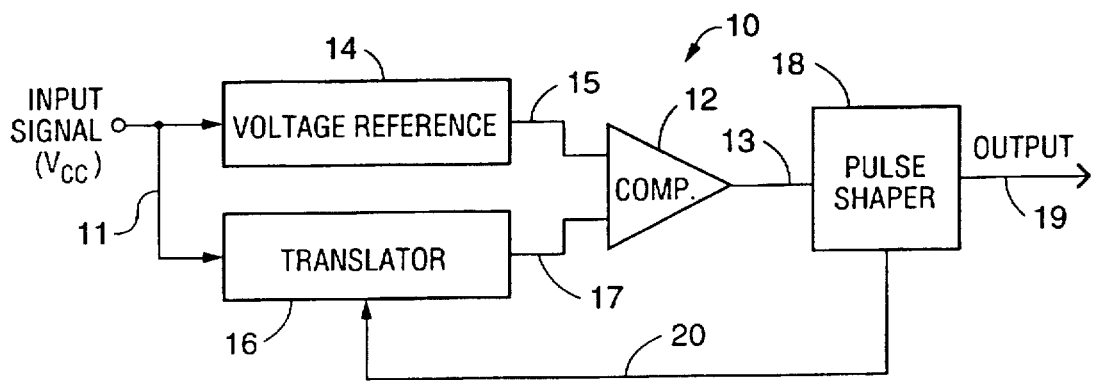
FIG. 1 is a simplified block diagram of the present invention.

Referring to the drawings, FIG. 1 is a block diagram of the subject Level Detection Circuit 10. The Input Signal on line 11 can be, by way of example, the primary supply voltage $V_{cc}$ for the system. In that event, all of the various elements of the system are also powered by the Input Signal. Circuit 10 includes a Comparator circuit which compares the output of a Voltage Reference circuit 14 on line 15 and the output of a Translator circuit 16 on line 17. The Translator circuit provides an output indicative of the magnitude of the Input Signal. When the output of the Translator circuit 16 exceeds that of the Voltage Reference 14, the Comparator circuit 12 output on line 13 changes state thereby indicating that the Input Signal is at a predetermined minimum voltage level (trip point level). A Pulse Shaper circuit 18 converts the output of the Comparator circuit 12 to the Detection Circuit 10 output on line 19 in the form of a pulse suitable for resetting the various logic elements of the associated system powered by Input Signal $V_{cc}$. All of the elements of the subject Level Detection circuit 10 are typically implemented in a common integrated circuit.

The function of the Voltage Reference circuit 14 is to produce a reference voltage which is relatively independent of the Input Signal $V_{cc}$. Since the Voltage Reference circuit 14 is powered by the Input Signal in the present example, the output reference voltage will not be produced until the Input Signal reaches some minimum value. To ensure proper operation of the Detection Circuit 10, that minimum value of Input Signal must be less than the trip point level of the Detection Circuit 10. The phrase "relatively independent" means that a variation in the Input Signal produces a corresponding variation in the magnitude of the Voltage Reference circuit output which is 30% or less than that of the Input Signal. For example, if the Input Signal has a nominal value of +3.3 volts and varies 50% (1.65 volts) and the output reference voltage has a nominal value of +0.8 volts, the reference voltage output can vary only 15% (0.12 volts) or less (30% of 50%) in order to be considered relatively independent of the Input Signal.

As previously noted, the Translator circuit 16 functions to produce an output signal which is indicative of the magnitude of the Input Signal. The magnitude of the output of Translator circuit 16 is selected to be equal to that of the Voltage Reference circuit 14 when the Input Signal is at the trip point level.

Figure 2:
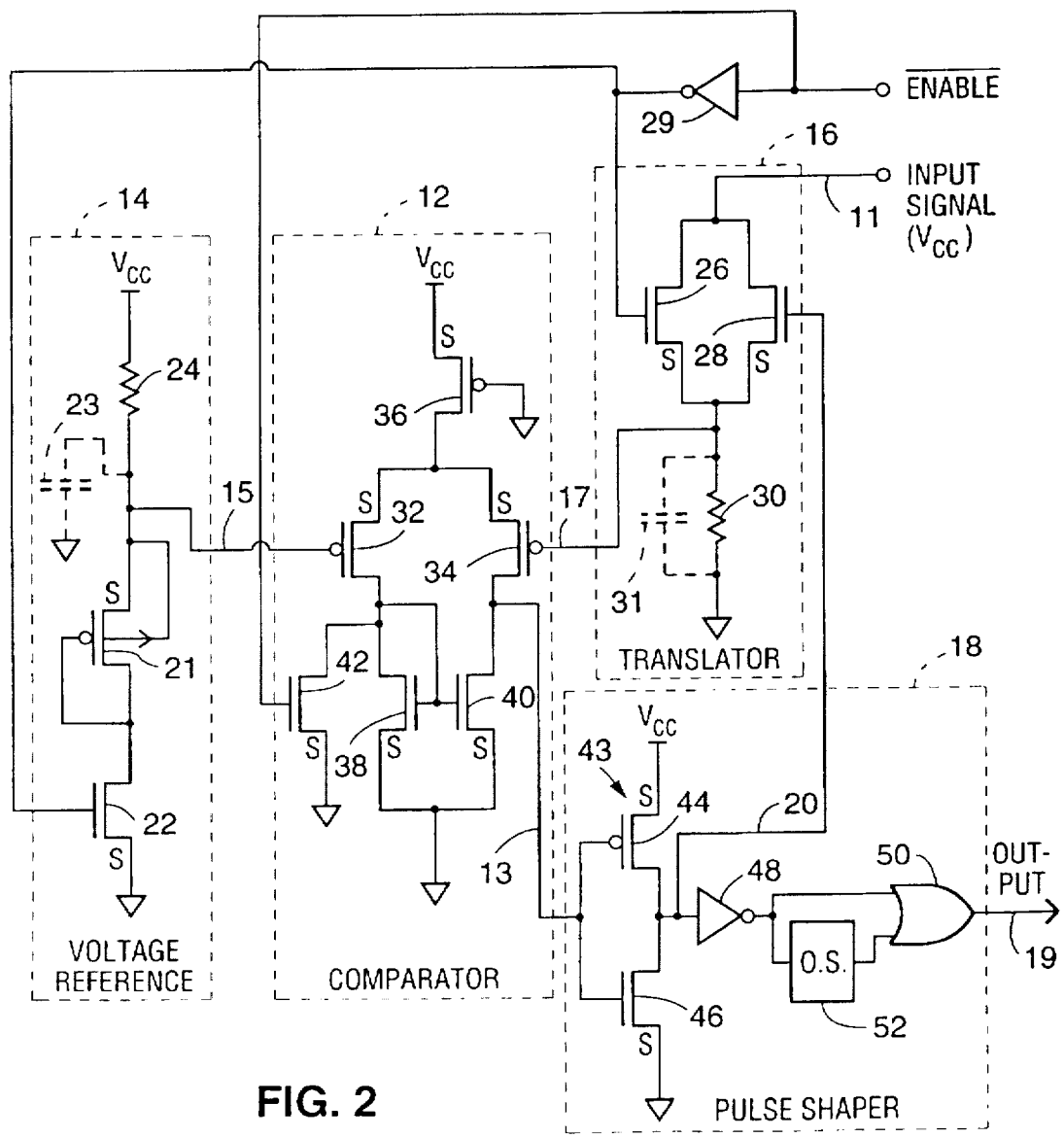
FIG. 2 is a detailed schematic diagram of the present invention.

FIG. 2 is an exemplary implementation of the FIG. 1 circuit. The Voltage Reference circuit 14 includes a diode-connected P channel transistor 21 connected in series with an N channel transistor 22. As will be explained, when the system is enabled, transistor 22 is conductive so that the drain of transistor 21 is effectively connected to the circuit common. The source and body (N well) of transistor 21 is connected to the Input Signal $V_{cc}$ by way of a resistor 24 for the purpose of powering the Voltage Reference circuit 14. A small parasitic capacitor 23 is associated with resistor 24. The output of the Voltage Reference circuit 14 at the junction of transistor 21 and resistor 24 is connected to one input of Comparator circuit 12 by way of line 15.

The Translator circuit 16 of FIG. 2 includes a pair of N channel transistors 26 and 28 connected in parallel, with the drain of both transistors connected to the Input Signal $V_{cc}$ on line 11. The common sources of transistors 26 and 28 are connected to one terminal of a resistor 30 and to the remaining input of Comparator circuit 12 by way of line 17. The other terminal of resistor 30 is connected to the circuit common. A small parasitic capacitor 31 is associated with resistor 30. As will be explained, in normal operation, and at low levels of the Input Signal, transistor 26 is conductive and transistor 28 is off. A voltage will be generated on line 17 indicative of the magnitude of the Input Signal. Transistor 28 will be made conductive once the Input Signal reaches the trip point level so as to provide hysteresis, as will also be explained.

The Comparator circuit 12 includes a pair of differentially-connected P channel transistors 32 and 34. The common sources of transistors 32 and 34 are connected to a tail current source formed by a P channel transistor 36. The source of transistor 36 is connected to Input Signal $V_{cc}$ for the purpose of powering the Comparator circuit 12. Circuit 12 includes a current mirror load comprising N channel transistors 38 and 40 having their sources connected, to the circuit common. Transistor 38 is connected as a diode, with the drain and gates connected together and to the drain of input transistor 32. Transistor 40 has its gate connected to the gate-drain of transistor 38 and its drain connected to the drain of input transistor 34 and to the Comparator circuit output on line 13. As will be explained, an N channel transistor 42 is connected in parallel with load transistor 38, with transistor 42 being off in normal operation.

The Pulse Shaper circuit 18 includes an inverter circuit 43 comprising a P channel transistor 44 and an N channel transistor 46 with their common gates connected together to receive the output of the Comparator Circuit on line 13. The inverter 43 is powered by the Input Signal $V_{cc}$. The output of the inverter 43 at the common drain connection of transistors 44 and 46 on line 20 is connected to one input of an OR gate 50 by way of inverter 48. The output of inverter 48 is also connected to the input of a One Shot circuit 52, with the output of the One Shot being connected to another input of OR gate 50. One Shot 52 is implemented to trigger on a falling edge of the input and produce a fixed duration output pulse. In addition, the output on line 20 is connected to the gate of transistor 28 to provide hysteresis. The output of OR gate 19 provides the Output of the Level Detection circuit 10 on line 19.

Figure 3A:
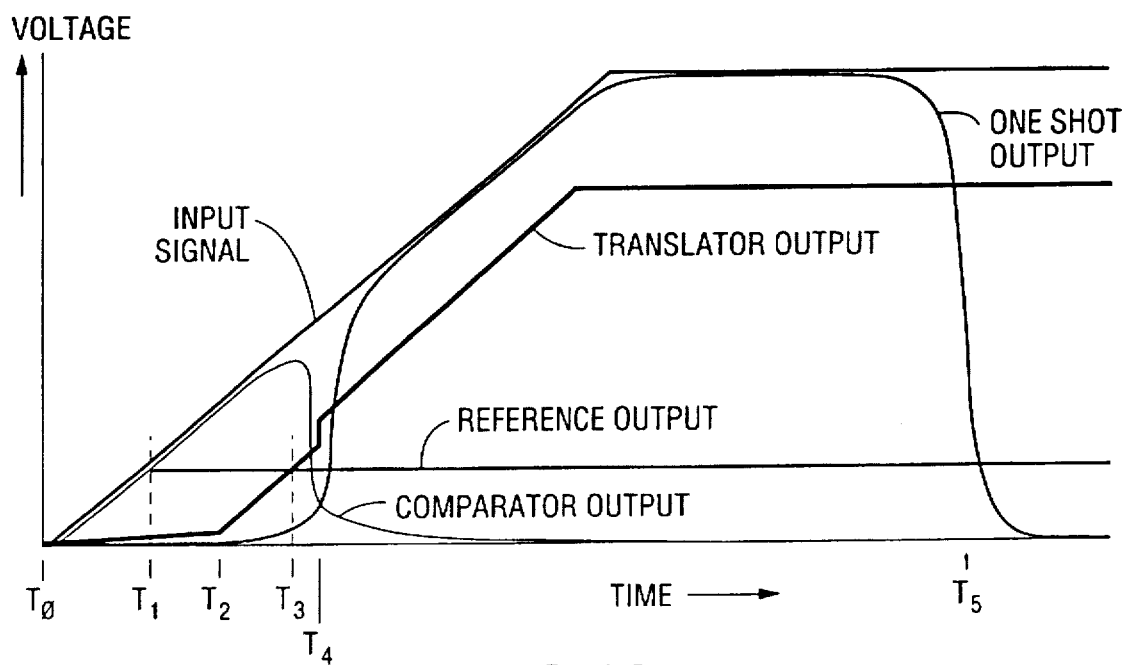
FIGS. 3A and 3B are timing diagrams illustrating the operation of the present invention.
Figure 3B:
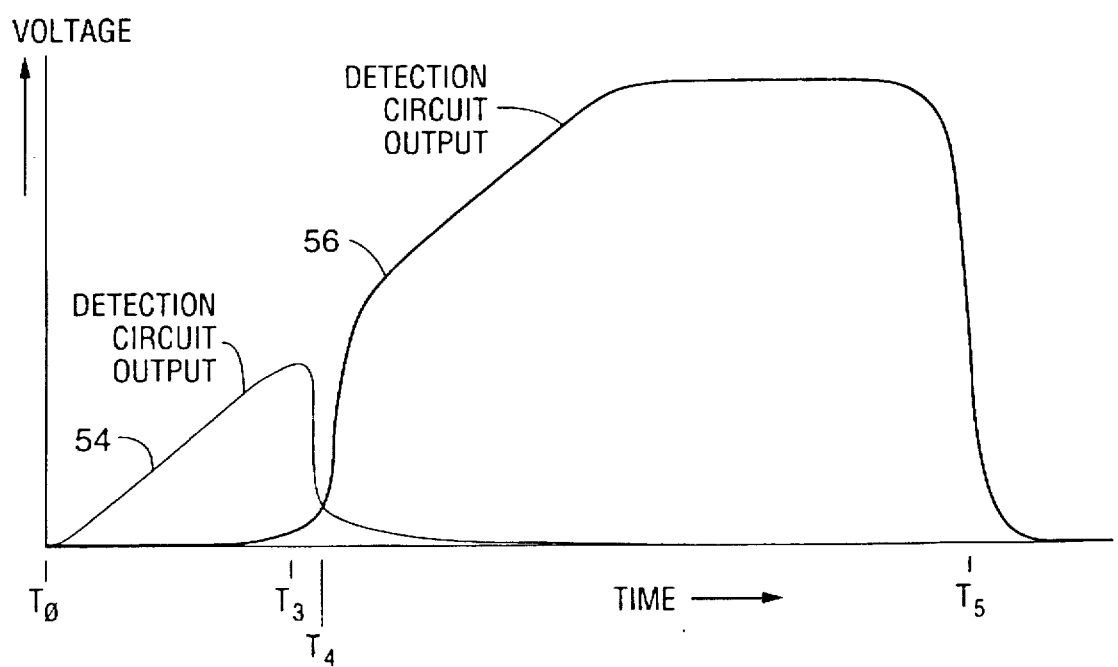

Having described the construction of the Level Detection circuit, operation of the circuit will now be explained. Reference will be made to both FIG. 2 and the FIGS. 3A and 3B timing diagrams. The FIG. 3A timing diagram depicts five signals, including the Input Signal $V_{cc}$ on line 11, the Voltage Reference circuit output on line 15, the Translator circuit output on line 17, the Comparator circuit output on line 13 and the One Shot circuit 52 output. FIG. 3A illustrates operation when power in the form of voltage $V_{cc}$, the Input Signal, is first applied at time $T_0$. At this point, an ENABLE signal which is active low, is made active so that the Level Detection circuit will perform its normal function. The ENABLE signal is made high for the purpose of disabling various one of the system circuits in order to reduce power consumption in certain low power modes of operation. The timing diagram of FIG. 3B illustrates the two signals that are logically ORed together to form the Level Detection circuit 10 output on line 19. The first signal 54 is essentially the output of the Comparator circuit 12 and the second signal 56 is the One Shot output 56.

At time $T_0$ (FIG. 3A), the Input Signal is still at ground potential. Since all of the FIG. 2 components are powered by the Input Signal $V_{cc}$, the remaining four signals of the FIG. 3A timing diagram will also be at ground potential. Further, since signal ENABLE is low, the output of inverter 29 will be high and essentially equal to the magnitude on the Input Signal since inverter 29 is also powered by the Input Signal $V_{cc}$. As will be explained, transistor 28 is non-conductive at this point. Transistor 26 functions essentially as a source follower circuit with the gate voltage being approximately equal to the Input Signal, with the source voltage following the gate voltage, and with the two voltages differing from one another by a relatively fixed voltage somewhat larger than the threshold voltage of transistor 26. However, at very low Input Signal levels, there is insufficient voltage for transistor 26 to function as a source follower.

As the Input Signal approaches time $T_1$, there will be very little current flowing through transistors 26 and 28 or resistor 30 so that the voltage output of the Translator circuit 16 will be at ground level. Coupling due to capacitor 31 will function to maintain the Translator circuit output on line 17 close to ground level at this stage of the sequence. Thus, the input of the Comparator circuit 12 on line 17 will be at a minimum level. In addition, at this point there is still insufficient voltage for transistor 21 of the Voltage Reference circuit 14 to be conductive. Since transistor 21 is off, there will be no voltage drop across resistor 24 so that the Voltage Reference output on line 15 will be equal to the Input Signal, as can be seen in FIG. 3A.

Although the Comparator circuit 12 is not fully functioning at this point, it can be seen that one input on line 17 is at a minimum value and the other input on line 15 is at a maximum value. This will tend to force most of the current from the tail current transistor 36 to output transistor 40 as opposed to transistor 38 thereby causing the Comparator output on line 13 to be at some maximum value. This will cause inverter 48 output to also be at a maximum value approaching the Input Signal as can be seen in FIG. 3A. This is important since the Comparator circuit 12 output (curve 54 of FIG. 3B) at this point in time is used as part of the Level Detection output for resetting various system elements and the output should be at a maximum value.

At about time $T_1$, the Input Signal is at a voltage approaching the threshold voltage of transistor 21. (The term threshold voltage of a transistor is used here to mean the gate-source voltage required to cause the transistor to conduct a drain-source current of 1 micro-ampere when the drain-source voltage is 1 volt.) The Voltage Reference output on line 15 is at its final value and will thereafter be relatively independent of the Input Signal. The Comparator circuit output will continue to follow the Input Signal at this point, as also indicated by waveform 54 of FIG. 3B.

At time $T_2$, the voltage across the Translator transistor 26 will be sufficient for the transistor to become active. As can be seen in the FIG. 3A timing diagram, the Translator signal begins to increase at the same rate of increase as the Input Signal at this point. As can be seen from the FIG. 3A timing diagram, as the Input Signal magnitude increases, the output of the Voltage Reference remains relatively constant and independent of the Input Signal. This independence is enhanced by taking steps to ensure that the gate-source voltage of transistor 21 remains close to the threshold voltage of the transistor. This is done by minimizing the magnitude of the current flow through the transistor which can be achieved by using a large value of resistance for resistor 24. In addition, a large geometry transistor, that is, a large channel width to channel length ratio (W/L) will help ensure that the gate-source voltage remains close to the threshold voltage. In addition, by connecting the body of transistor 21 (the N well in which the transistor is formed) to the source, the threshold voltage of transistor 21 will remain constant and will not change due to the body effect.

Thus, at time $T_2$, the various circuits which make up the subject Level Detection circuit 10 will have sufficient voltage to function in some manner. Comparator circuit 12 will continue to provide the desired polarity output but will not be fully functional as a comparator until the Input Signal is at least equal to the sum of the threshold voltages of transistors 32 and 38. Up to this point, the magnitude of the Voltage Reference circuit output on line 15 will be larger than that of the Translator circuit 16 output on line 17. Essentially all of the current provided by tail current source transistor 36 will flow through input transistor 34 so that the output of the Comparator circuit 12 on line 13 will be at a "high" level approaching the magnitude of the supply voltage, that is, the magnitude on the Input Signal $V_{cc}$.

With a high Comparator circuit output, the output of inverter 43 on line 20 will be at a low level. This low level will keep hysteresis transistor 28 in an off state. In addition, the low level will not trigger One Shot 52 and the normally low output of the One Shot will remain low. The output of inverter 48 will also be high so that one input of OR gate 19 will be high. Thus, as can be seen from waveform 54 of the FIG. 3B timing diagram, the output of the Level Detection circuit 10 will be at a high level, at least as high as the Input Signal $V_{cc}$ will permit at this point in the power on sequence.

Eventually, at time $T_3$, the Input Signal has reached the predetermined level at which the subject Level Detection circuit 10 was designed to provide a pulse output. At this point, the Translator output has reached the same level as the Voltage Reference output. Comparator circuit 12 has sufficient gain so that all of the current from tail current source transistor 36 flowing into transistor 34 will switch to transistor 32. Thus, as can be seen from FIG. 3A, the output of the Comparator circuit on line 13 will switch from a high to a low state approaching the circuit common shortly after time $T_3$.

Inverter 43 will invert the Comparator output and the gain of the inverter will increase the rise and fall times of the signal. Inverter 43 will also convert the signal levels to be between approximately ground level and the Input Signal level $V_{cc}$. The output of inverter 43 is inverted again by inverter 48 and the falling edge of the output of inverter 48 will trigger One Shot 52. One Shot 52 will produce a positive output pulse of fixed duration as can be seen in FIG. 3A. As previously noted, the One Shot 52 output is ORed by gate 50 with the output of inverter 48, with this output being similar to the output of Comparator circuit 12 shown in FIG. 3A. The combined outputs which form the Detection Circuit 10 output are shown in the FIG. 3B timing diagram, with waveform 56 representing the contribution made by One Shot 52.

When Comparator circuit 12 changes state at time $T_3$, causing the output of inverter 43 on line 20 to go high, hysteresis transistor 28 will turn on. This will slightly increase the Translator circuit 16 output voltage on line 17, as can be seen in FIG. 3A. This positive feedback reinforces the increase in the Input Voltage $V_{cc}$ and prevents the Comparator circuit 12 from switching back to the original state should there be noise on the Input Signal just when the Comparator circuit is switching at time $T_3$.

It is possible that the system being initialized by the subject Level Detection circuit will begin to function in some respect before the Input Signal $V_{cc}$ reaches the trip point. Since the voltage at this point is very low, it is possible that improper functions will be carried out that will damage the system. For example, if the system is a memory, it is possible that erase circuitry will be improperly activated at low voltage which will erroneously erase some part of the memory. This problem is particularly acute when the supply voltage has a very slow rise time. Accordingly, it is often desirable to force the circuitry to a known state at very low voltages and to remove the resetting pulse well after the voltage is at a proper level. This is accomplished in the present case by ORing the Comparator output (as amplified by inverter 43, with the One Shot 52 output. The amplified Comparator output, represented by waveform 54 of FIG. 3B, will tend to hold the various system components in a reset state even for very slow Input Signal rise times and for low Input Signal levels. Once the Input Signal is at the predetermined trip point, the One Shot output pulse, as represented by waveform 56, will hold the system components in the reset state and will finally release the components at time $T_5$. Capacitors 23 and 31 will tend to filter the Input Signal Vcc so that narrow negative going voltage spikes on voltage Vcc will be less likely to trigger the subject Level Detection circuit.

When the Level Detection circuit is placed in a non-enabled mode of operation, signal $\overline{\text{ENABLE}}$ is inactive (high). Thus, the gate of transistor 22 will be low thereby turning off transistor 22 so as to disable the Voltage Reference circuit 14. In addition, transistor 42 will be conductive thereby disabling the Comparator circuit 12 and transistor 26 will be off thereby disabling the Translator circuit 16.

Thus, a novel level detection circuit has been disclosed. Although one embodiment has been described in some detail, it is to be understood that certain changes can be made by those skilled in the art without departing from the spirit and scope of the invention as defined by the appended claims. By way of example, the transistors can be replaced with complementary devices and the polarity of the supply voltages reversed.

We claim:

1. A level detection circuit which produces a detection output signal when an input signal reaches a predetermined level, said detection circuit comprising:

a voltage reference circuit configured to produce a reference voltage having a magnitude which is relatively independent of the input signal magnitude at least once the input signal has reached a first operating voltage;

a translator circuit, operably coupled to receive the input signal, said translator circuit being configured to produce a translated voltage having a magnitude which is indicative of the magnitude of the input signal;

a comparator circuit, operably coupled to the voltage reference circuit and the translator circuit, said comparator circuit being configured to compare the reference voltage and the translated voltage and for producing a comparator output based upon the comparison, with the comparator circuit being powered by the input signal; and an output circuit, operably coupled to the comparator circuit, said output circuit being configured to produce the detection output signal in response to the comparator output, with the output circuit including a one shot circuit configured to produce an output pulse, having a duration greater than a predetermined minimum duration, in response to the comparator output and including logical combining circuitry, operably coupled to the comparator circuit and to the one shot circuit, said logical combining circuitry being configured to produce the detection output signal when either the output pulse or the comparator output are present.

2. The level detection circuit of claim 1, wherein the voltage reference circuit is powered by the input signal and wherein the logical combining circuitry includes an OR gate circuit.

3. The level detection circuit of claim 2 wherein the translator circuit is powered by the input signal and wherein the output pulse and the comparator output are positive-going signals relative to a circuit common.

4. The level detection circuit of claim 1 wherein the reference voltage produced by the voltage reference circuit is derived from the threshold voltage of a transistor.

5. The level detection circuit of claim 4 wherein the transistor of the voltage reference circuit is a P channel transistor.

6. The level detection circuit of claim 5 wherein the reference voltage is approximately equal to the threshold voltage of the transistor and said operating voltage is equal to the threshold voltage.

7. The level detection circuit of claim 4 wherein the transistor of the voltage reference circuit has a gate and drain coupled together and the reference voltage is equal to the a gate-source voltage of the transistor.

8. The level detection circuit of claim 7 wherein the voltage reference circuit comprises a resistor connected in series with the transistor.

9. The level detection circuit of claim 8 wherein the resistor is connected intermediate the transistor and a node where the input signal is applied to the voltage reference circuit.

10. The level detection circuit of claim 9 further including a capacitor coupled between a junction of the transistor and the resistor and a circuit common.

11. The level detection circuit of claim 4 wherein the comparator circuit comprises a first and second differentially-connected P channel transistors, with the first P channel transistor having a gate which receives the reference voltage and the second P channel transistor having a gate which receives the translated voltage.

12. The level detection circuit of claim 11 wherein the comparator circuit comprises a pair of N channel transistors connected with respect to the first and second P channel transistors to form a current mirror load.

13. The level detection circuit of claim 1 wherein the comparator circuit changes from a first state to a second state when the input signal is at a first level and from the second state to the first state when the input signal is at a second level and the level detection circuit further includes feedback circuitry configured to generate a feedback signal in response to the comparator output which causes the second level to differ from the first level.

14. The level detection circuit of claim 13 wherein the input signal is a positive voltage with respect to a circuit common and wherein the feedback circuitry is configured to cause the input signal second level to be at a voltage different than the input signal at the first level.

15. The level detection circuit of claim 14 wherein the translator circuit includes a first N channel transistor having its drain-source connected between the input signal and a translator circuit output where the translated voltage is produced.

16. The level detection circuit of claim 15 wherein the translator circuit includes a resistor connected between the translator circuit output and a circuit common.

17. The level detection circuit of claim 16 wherein the translator circuit includes a capacitor coupled between the translator circuit output and the circuit common.

18. The level detection circuit of claim 15 further including feedback circuitry configured to alter the magnitude of the translated voltage in response to the comparator output.

19. The level detection circuit of claim 18 wherein the feedback circuitry includes a second N channel transistor having a drain and source connected in parallel with the drain and source of the first N channel transistor and a gate signal having a magnitude which varies with the comparator output.

20. The level detection circuit of claim 1 wherein the level detection circuit is switchable between an enabled mode of operation and a disabled mode of operation in response to an enable signal and wherein the translated voltage of the translator circuit differs from the input signal voltage by the drain-source voltage of a transistor and wherein the transistor switches between a conductive and a non-conductive state in response to the enable signal.

21. The level detection circuit of claim 1 wherein the voltage reference circuit, the translator circuit, the comparator circuit and the output circuit are formed in a common integrated circuit.

22. A level detection circuit for producing an detection output signal when an input signal reaches a predetermined level, said detection circuit comprising:

a voltage reference circuit configured to produce a reference voltage having a magnitude which is relatively independent of the input signal magnitude at least once the input signal has reached a first operating voltage;

a translator circuit configured to produce a translated voltage having a magnitude which is indicative of the magnitude of the input signal, with the translator circuit being powered by the input signal;

a comparator circuit, operably coupled to the voltage reference circuit and to the translator circuit, said comparator circuit being configured to compare the reference voltage and the translated voltage and to produce a comparator output based upon the comparison, with the comparator output changing from a first state to a second state based upon relative magnitudes of the reference voltage and translated voltage, with the comparator circuit being powered by the input signal; and an output circuit, operably coupled to the comparator circuit, said output circuit being configured to produce the detection output signal in response to the comparator output, with the output circuit being powered by the input signal and with the output circuit being further configured to produce a first component of the output signal prior to the comparator output changing from the first state to the second state which is indicative of the input signal magnitude and configured to produce a second component of the output signal in the form of a pulse having a duration greater than a predetermined minimum duration subsequent to the comparator output changing from the first state to the second state.

23. The level detection circuit of claim 22 wherein the voltage reference circuit is powered by the input signal and the reference voltage is derived from the threshold voltage of a first transistor and wherein the translated voltage differs from the input signal voltage by the drain-source voltage of a second transistor.

24. The level detection circuit of claim 23 wherein the first transistor is a P channel transistor and the second transistor is an N channel transistor and the comparator circuit includes a pair of differentially-connected P channel transistors having their gates connected to receive the translated voltage and the reference voltage, respectively.

25. The level detection circuit of claim 24 wherein the comparator circuit includes a pair of N channel transistors connected with respect to the pair of P channel transistors so as to form a current mirror load.

26. The level detection circuit of claim 25 wherein the level detection circuit is switchable between an enable mode of operation and a disabled mode of operation in response to an enable signal and wherein the second transistor of the translator circuit switches between a conductive state and a non-conductive state in response to the enable signal.

27. The level detection circuit of claim 26 wherein the voltage reference circuit includes a first enable transistor having its drain and source connected in series with the drain and source of the first transistor, with the first enable transistor switching between a conductive state and a non-conductive state in response to the enable signal.

28. The level detection circuit of claim 27 wherein the comparator circuit includes a second enable transistor connected in parallel with one of the N channel load transistors, with the second enable transistor switching between a conductive and non-conductive state in response to the enable signal.

29. The level detection circuit of claim 22 wherein the reference voltage is derived from the threshold voltage of a transistor and wherein the transistor has a body and a source coupled together.

30. The level detection circuit of claim 29 wherein the transistor is a P channel transistor formed in an N type well, with the N type well being the transistor body.

31. A level circuit for producing a detection output signal when a input signal reaches a predetermined level, said detection circuit comprising:

a voltage reference circuit configured to produce a reference voltage having a magnitude which is relatively independent of the input signal magnitude at least once the input signal has reached a first operating voltage, with the reference voltage being equal to the gate-source voltage a transistor having a gate and drain connected together, with the voltage reference circuit including a resistor connected in series with the transistor, intermediate the transistor and a node where the input signal is applied, and a capacitor coupled between a junction of the resistor and the transistor and a circuit common;

a translator circuit, operably coupled to receive the input signal, said translator circuit being configured to produce a translated voltage having a magnitude which is indicative of the magnitude of the input signal;

a comparator circuit operably coupled to the reference circuit and to the translator circuit, said comparator circuit being configured to compare the reference voltage and the translated voltage and to produce a comparator output based upon the comparison, with the comparator circuit being powered by the input signal; and output circuitry, operably coupled to the comparator circuit, said output circuitry being configured to produce the detection output signal in response to the comparator output.

32. A level detection circuit for producing a detection output signal when an input signal reaches a predetermined level, said detection circuit including:

a voltage reference circuit configured to produce a reference voltage having a magnitude which is relatively independent of the input signal magnitude at least once the input signal has reached a first operating voltage;

a translator circuit, operably coupled to receive the input signal, said translator circuit being configured to produce a translated voltage having a magnitude which is indicative of the magnitude of the input signal and including a first N channel transistor having its drain-source connected between the input signal and a translator circuit output where the translated voltage is produced and including a resistor connected between the translator circuit output and a circuit common and a capacitor coupled between the translator circuit output and the circuit common;

a comparator circuit, operatively coupled to the translator circuit and to the voltage reference circuit, said comparator being configured to compare the reference voltage and the translated voltage and to produce a comparator output based upon the comparison, with the comparator circuit being powered by the input signal and with the comparator circuit being configured to change from a first state to a second state when the input is at a first level and from the second state to the first state when the input is at the second level;

output circuitry, operably coupled to the comparator circuit, said output circuitry being configured to produce the detection output signal in response to the comparator output; and feedback circuitry, operably coupled to the output circuitry, said feedback circuitry being configured to generate a feedback signal in response to the comparator output which causes the first level to differ from the second level and wherein the input voltage is a positive voltage with respect to the circuit common and the feedback circuitry is configured to cause the input signal second level to be at a voltage different than the input signal at the first level.

33. A level detection circuit for producing a detection output signal when an input signal reaches a predetermined level, said detection circuit being switchable between an enabled mode and a disabled mode of operation in response to an enable signal and including:

a voltage reference circuit configured to produce a reference voltage having a magnitude which is relatively independent of the input signal magnitude at least once the input signal has reached a first operating voltage;

a translator circuit, operably coupled to receive the input signal, said translator circuit being configured to produce a translated voltage having a magnitude which is indicative of the magnitude of the input signal, with the translator circuit including a transistor connected such that the translated voltage differs from the input signal voltage by the drain-source voltage of the transistor and wherein the transistor switches between a conductive and non-conductive state in response to the enable signal;

a comparator circuit operably coupled to the voltage reference circuit and to the translator circuit, said comparator circuit being configured to compare the reference voltage and the translated voltage and to produce a comparator output based upon the comparison, with the comparator circuit being powered by the input signal; and output circuitry, operably coupled to the comparator circuit, said output circuitry being configured to produce the detection output signal in response to the comparator output.

34. A level detection circuit for producing a detection output signal when an input signal reaches a predetermined level, said detection circuit being switchable between an enabled mode of operation and a disabled mode of operation in response to an enable signal and including:

- a voltage reference circuit configured to produce a reference voltage having a magnitude which is relatively independent of the input signal magnitude at least once the input signal has reached a first operating voltage, with the voltage reference circuit being powered by the input signal and including a first P channel transistor, with the reference voltage being derived from a threshold voltage of the first transistor;
- a translator circuit, operably coupled to receive the input signal, said translator circuit being configured to produce a translated voltage having a magnitude which is indicative of the magnitude of the input signal, with the translator circuit being powered by the input signal and including a second N channel transistor and wherein the translated voltage differs from the input signal voltage by the drain-source voltage of the second transistor, with the second transistor switching between a conductive state and a non-conductive state in response to the enable signal;
- a comparator circuit operably coupled to the voltage reference circuit and to the translator circuit, said comparator circuit being configured to compare the reference voltage and the translated voltage and to produce a comparator output based upon the comparison, with the comparator circuit being powered by the input signal, with the comparator circuit including a pair of differentially-connected P channel transistors having their gates connected to receive the translated voltage and the reference voltage, respectively and a pair of pair of N channel transistors connected with respect to the pair of P channel transistors so as to form a current mirror load; and
- output circuitry operably coupled to the comparator circuit and configured to produce the detection output signal in response to the comparator output, with the output circuitry being powered by the input signal.

35. The level detection circuit of claim 34 wherein the voltage reference circuit includes a first enable transistor having its drain and source connected in series with the drain and source of the first transistor, with the first enable transistor switching between a conductive state and a non-conductive state in response to the enable signal.

36. The level detection circuit of claim 35 wherein the comparator circuit includes a second enable transistor connected in parallel with one of the N channel load transistors, with the second enable transistor switching between a conductive and a non-conductive state in response to the enable signal.

37. A method of monitoring an input signal which is increasing in magnitude and generating an output signal when the input signal reaches a predetermined level, said method comprising the following steps:

- supplying a reference voltage having a magnitude which is relatively independent of the input signal magnitude, at least once the input signal has reached a first operating voltage level;
- generating a translated voltage having a magnitude which is smaller than that of the input signal and which is indicative of the magnitude of the input signal;
- comparing the reference voltage and the translated voltage;
- producing a compare signal based upon said step of comparing;
- generating a pulse signal in response to the compare output, with the pulse signal having a duration greater than a predetermined minimum duration; and
- producing the detection output signal when either the pulse signal or the compare signal are present.

38. The method of claim 37 wherein the step of supplying a reference voltage includes the steps of providing a voltage reference circuit and powering the voltage reference circuit using the input signal.

39. The method of claim 38 wherein the step of supplying a reference voltage includes the step of deriving the reference voltage from a threshold voltage of a transistor of the voltage reference circuit.

40. A method of monitoring an input signal which is increasing in magnitude and generating an output signal when the input signal reaches a predetermined level, said method comprising the following steps:

- supplying a reference voltage having a magnitude which is relatively independent of the input signal magnitude, at least once the input signal has reached a first operating voltage level;
- generating a translated voltage having a magnitude which is smaller than that of the input signal and which is indicative of the magnitude of the input signal;
- comparing the reference voltage and the translated voltage so as to produce a compare output, said step of comparing including the steps of applying the reference voltage to a gate of a first P channel transistor, applying the translated voltage to a gate of a second P channel transistor and generating the compare output indicative of a difference in current flow through the first and second P channel transistors;
- generating a pulse signal in response to the compare output, with the pulse signal having a duration greater than a predetermined minimum duration; and
- producing the detection output signal when either the pulse signal or the compare signal are present.

41. The method of claim 40 wherein the step of generating the compare output indicative of a difference in current flow comprises the steps of connecting a drain of a first one of the P channel transistors to a drain of a first N channel transistor so as to generate a gate-source voltage on the first N channel transistor, applying the gate-source voltage across a gate and source of a second N channel transistor, generating the compare output as a function of a difference in current flow through the second N channel transistor and a second one of the P channel transistors.

* * * * *